United States Patent
Bostick

(10) Patent No.: US 11,234,346 B2
(45) Date of Patent: Jan. 25, 2022

(54) PASSIVE CONTROL VALVE AND SYSTEM FOR REGULATING FLOW OF FLUID TO A HEAT SOURCE IN A COMPUTER PROCESSOR SYSTEM IN RESPONSE TO THE TEMPERATURE OF THE SOURCE, AND METHOD

(71) Applicant: Nooter/Eriksen, Inc., Fenton, MO (US)

(72) Inventor: Glen L. Bostick, Columbia, IL (US)

(73) Assignee: Nooter/Eriksen, Inc., Fenton, MO (US)

( * ) Notice: Subject to any disclaimer, the term of this patent is extended or adjusted under 35 U.S.C. 154(b) by 148 days.

(21) Appl. No.: 16/374,261

(22) Filed: Apr. 3, 2019

(65) Prior Publication Data

US 2020/0229322 A1  Jul. 16, 2020

Related U.S. Application Data

(60) Provisional application No. 62/790,833, filed on Jan. 10, 2019.

(51) Int. Cl.
*H05K 7/20* (2006.01)
*F16K 31/00* (2006.01)
*F16K 37/00* (2006.01)
*F16K 31/42* (2006.01)

(52) U.S. Cl.
CPC ....... *H05K 7/20836* (2013.01); *F16K 31/002* (2013.01); *H05K 7/208* (2013.01); *F16K 31/426* (2013.01); *F16K 37/005* (2013.01)

(58) Field of Classification Search
CPC ..... G05D 23/08; F16K 31/426; F16K 31/002; H05K 7/208; H05K 7/20836
See application file for complete search history.

(56) References Cited

U.S. PATENT DOCUMENTS

| 2009/0114370 A1* | 5/2009 | Konig | G06F 1/20 165/47 |
| 2017/0241675 A1 | 8/2017 | Autry | |
| 2019/0327860 A1* | 10/2019 | Edwards | H05K 7/20809 |

FOREIGN PATENT DOCUMENTS

WO   WO-2012069435 A1 *  5/2012  ............. G05D 23/08

OTHER PUBLICATIONS

WO2012069435A1 Translation (Year: 2012).*

* cited by examiner

*Primary Examiner* — Schyler S Sanks
(74) *Attorney, Agent, or Firm* — Sandberg Phoenix and von Gontard, P.C.

(57) ABSTRACT

A system and method for computer data processing systems of cooling or heating a plurality of objects (heat sources), such as processors in a data center or the like, is disclosed with each of the objects having a control valve associated therewith. Each of the objects is in communication with a supply of a coolant fluid and each control valve has an inlet for receiving coolant fluid from its respective object which reflects the temperature of the object. The control valve has a chamber that receives coolant from its inlet and an outlet. A valve member within the chamber is movable in response to changes in temperature of the coolant fluid within the chamber between a closed position and an open position. The valve member is of a layers of dissimilar metal material having different coefficients of thermal expansion that changes shape in response to changes in temperature. The coolant is carbon dioxide ($CO_2$) that is in its supercritical state as it passes through the heat sources.

12 Claims, 5 Drawing Sheets

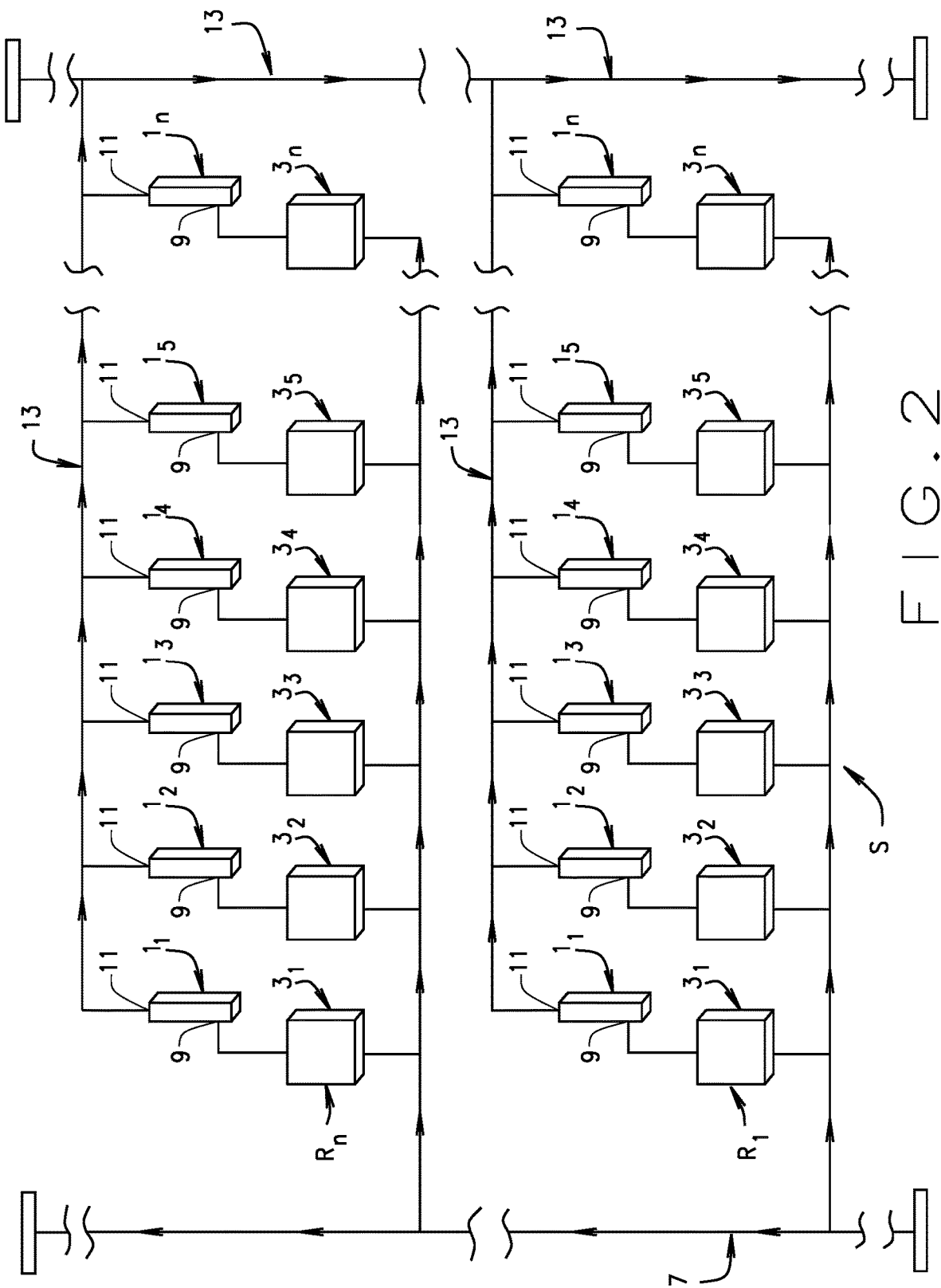

PASSIVE CONTROL VALVE AND SYSTEM FOR REGULATING FLOW OF FLUID TO A HEAT SOURCE IN A COMPUTER PROCESSOR SYSTEM IN RESPONSE TO THE TEMPERATURE OF THE SOURCE, AND METHOD

CROSS-REFERENCE TO RELATED APPLICATIONS

This application claims priority to U.S. Provisional Application No. 62/790,833, filed on Jan. 10, 2019, which is herein incorporated by reference in its entirety.

STATEMENT REGARDING FEDERALLY SPONSORED RESEARCH

Not Applicable.

BACKGROUND OF THE DISCLOSURE

In certain cooling and heating applications for computer data processing systems, it is necessary to provide an influent (e.g., an operating fluid, such as coolant or a heating fluid) to one or to a plurality of heat sources so as to maintain each of the sources within a desired operating temperature range. One example of such multiple sources may be a plurality (or a multiplicity) of computer processors or other heat producing components in a data center having thousands of such heat sources that must be kept within a certain operating temperature range to prevent overheating and damage to the processor or other heat producing component. For microprocessors, cooling of the processor is typically carried out by incorporating a finned metal heat sink or other heat exchanger in conduction heat transfer relation with the processor. Oftentimes a fan is provided to blow air over or through the heat sink and the processor to remove heat. But in data centers with thousands of servers and with each server having at least one processor, the heat given off by thousands of such heat sources will overheat the room in which the processors are located such that the room must be cooled with a HVAC cooling system. The energy required to run such a HVAC cooling system is a substantial part of the total energy consumption of the data center.

In many applications, such HVAC air cooling systems may not adequately cool high heat output processors or other electronic components. In such applications, the processors may be cooled by, for example, liquid cold plates, radiators, or other heat exchangers that are in conduction heat transfer relation with the processors, where the cold plates or heat exchangers are cooled by a liquid coolant. In these systems, the liquid coolant may be distilled water, glycol, or even liquid nitrogen. One problem with liquid water cooling systems for electronic components is leakage of the water from the system may damage the electronic components.

One such system now being considered for processor cooling in a data center uses carbon dioxide ($CO_2$), either in the liquid state or supercritical state, as the coolant fluid. This cooling system is described in U.S. Patent Publication 2017/0241675, which is herein incorporated by reference in its entirety. Supercritical $CO_2$ must be maintained above its critical point, i.e., above its critical temperature of 31.01° C. (87.98° F.) and above its critical pressure of 72.9 bar (1,071 psi). Supercritical $CO_2$ behaves as a supercritical fluid in that it will expand to fill its container like a gas, but it has a density more like that of a liquid such that it may be pumped much like a liquid. Further advantages of supercritical $CO_2$ will be described hereinafter.

In using supercritical $CO_2$ coolant for cooling a great number of heat sources, such as a multiplicity of processors or the like in a data center, a problem has evolved because not all of the heat sources (processors) produce the same amount of heat at the same time and because the cooling demands for each individual processor can vary from minute-to-minute, depending on the usage demand for the processor. In addition, each processor's demand for cooling can increase or decrease almost instantaneously. Thus, over the course of a day, the coolant demand for such processors may be low, but at other times maximum cooling must be provided. In addition, processors operating at idle and outputting a minimum heat load still require some cooling to maintain the temperature of the processor within its desired operating temperature range. However, upon the processor generating a greater amount of heat, such as when it begins to operate in a high usage condition, increased cooling should be quickly supplied (almost instantaneously) to the processor so as to prevent the processor from overheating. It has been recognized that the "on demand" supplying of coolant to a multiplicity of processors is desirable because it would only require a minimal amount of cooling for those processors not being heavily used such that the bulk of the cooling capacity of the system is supplied to the processors having the highest cooling demand at the time. Yet, upon an individual processor or a group of processors have a sudden increase in heat output thus requiring a high demand for cooling, sufficient cooling fluid will be supplied to those processors almost instantaneously so as to maintain the operating temperature of those processors within a predetermined range of operating temperatures.

SUMMARY OF THE DISCLOSURE

The provision of a control valve for use with computer processors of the present disclosure, which also may be referred to as a Passive Temperature Gate, which regulates the flow of an operating fluid through a heat source (or through a heat exchanger in heat transfer relation with a heat source) so as to automatically provide for an increase or decrease in the flow of the operating fluid to the heat source of to the heat exchanger so as to keep the source within a desired operating temperature range;

The provision of a control valve for use with computer processors of the present disclosure that "automatically" increases or decreases the flow of the operating fluid to or through a heat source in response to the heat output of the source in order to maintain the source within a desired operating temperature range;

The provision of a control valve for use with computer processors of the present disclosure that may considered to be a "passive" controller because the control valve does not require normal drive sources (e.g., air, electricity, hydraulic fluid or the like), or active sensors for each heat source or an active control system to actuate the control valve.

The provision of a control valve for use with computer processors of the present disclosure having a valve member responsive to changes of in temperature of the operating fluid within the control valve, which temperature reflects the heat output of the heat source, to increase or decrease flow of the operating fluid to the heat source so as to maintain the temperature of the heat source to be within a desired range of operating temperatures;

The provision of a control valve for use with computer processors of the present disclosure having an outlet orifice or port that regulates the flow of the operating fluid through the control valve where the outlet orifice has a cross section of a predetermined size and shape such that as the valve member opens or closes the cross section of the orifice that is open to the flow of fluid from within the chamber to the outlet changes in relation to the position of the operating valve so as to result in either a linear or a non-linear increase or decrease in the of flow of the operating fluid through the orifice;

The provision of a control valve for use with computer processors of the present disclosure fabricated from suitable materials may utilize a wide variety of operating fluids (either a gaseous or a liquid operating fluid) having operating pressures ranging between sub-atmospheric and high pressures (e.g., to about 400 bar (5801 psi)), and having operating temperatures ranging from cryogenic levels to over than 1000° C. (1832° F.), depending on the operating fluid and the materials from which the control valve is constructed;

The provision of a control valve for use with computer processors of the present disclosure that allows a continuous minimal flow of the operating fluid through the control valve so as to insure that the above-said operating valve is effectively sensing the temperature of the heat source in substantially real time;

The provision of a control valve for use with computer processors of the present disclosure that allows a continuous minimal flow of the operating fluid through the control valve so as to insure that a heat source, when generating a low heat load, will have adequate cooling delivered thereto so as to insure that the heat source remains within its desired operating temperature range;

The provision of a control valve for use with computer processors of the present disclosure that may be used as a standalone controller for controlling the temperature of a single heat source or that may be arranged in a system for controlling the temperature of two or more heat sources with each heat source having a respective control valve and with each control valve operating independently to control each source to be within in a desired range of operating temperatures;

The provision of a control valve for use with computer processors of the present disclosure that has only a single moveable component and is of simple construction and operation, as compared to other conventional control valves;

The provision of a control valve for use with computer processors of the present disclosure that uses changes of temperature of the operating fluid exiting the heat source to regulate or maintain the temperature of the heat source within a desired range of operating temperatures where the control valve does not require external power, a computer controller, wiring, sensors, sensing signals, or remotely actuating a valve to achieve a desired temperature control over the heat source;

A control valve for use with computer processors of the present disclosure varies the supply of an operating fluid to a heat source, where the control valve is operable in response to a change in temperature of the source so as to maintain the temperature of the source within a desired operating temperature range. The control valve comprises a valve body having an inlet in communication with the operating fluid downstream of the source such that the temperature of the operating fluid reflects the temperature of the source and an outlet. A chamber is provided within the valve body in communication with the inlet and the outlet, and a valve member is disposed within the chamber that is responsive to changes in temperature of the fluid within the chamber for movement of the valve member between a closed position in which the valve member substantially blocks the flow of the fluid from the chamber and an open position in which the fluid within the chamber flows from chamber via the outlet. The valve member is of a material that changes its shape in response to changes of temperature of the fluid within the chamber to effect movement of the valve member between its closed and open positions;

Still further in accord with this disclosure, a computer system is disclosed for individually controlling the temperature of a multiplicity of heat sources to be within a desired range of operating temperatures for each of the sources. The computer system comprises a control valve associated with each of the sources for varying the flow of an operating fluid to each source so as to maintain the temperature of each source to be within its respective desired range of operating temperatures. The control valve comprises a valve body having a chamber therewithin. The chamber has an inlet in communication with the flow of the operating fluid from a respective source such that the temperature of the operating fluid entering the chamber via the inlet reflects the temperature of its respective source. The chamber has an outlet. A valve member is disposed in the chamber which is responsive to changes of in temperature of the operating fluid within the chamber for effecting movement of the valve member between a closed position in which the valve member substantially blocks the flow of the fluid from the chamber and an open position in which the operating fluid in the chamber flows from the chamber via the outlet thereby enabling additional operating fluid to flow to the source. The valve member is of a material that changes shape in response to the temperature of the operating fluid within the chamber so as to effect movement of the valve member between its closed and open positions;

In further accord with this disclosure, a cooling system for use with computer processors is disclosed for individually controlling the temperature of a multiplicity of processors or other heat generating components (heat sources) so that each of the processors does not to exceed a maximum operating temperature for that processor. The computer system comprises a control valve associated with each processor for varying the flow of a coolant fluid from a supply of coolant fluid to each processor. Each the control valve comprises a valve body having a chamber therewithin. The chamber has an inlet in communication with the flow of the coolant fluid from its respective processor such that the temperature of the coolant fluid entering the chamber reflects the temperature of its respective processor. The chamber has an outlet. A valve member is disposed in the chamber responsive to changes in temperature of the coolant fluid within the chamber for effecting movement of the valve member between a closed position in which the valve member substantially blocks the flow of coolant fluid from the chamber and hence from it respective processor and an open position in which the coolant fluid in the chamber may flow from the chamber via the outlet so that coolant fluid may flow to its respective processor thereby to further cool its respective the processor. The valve member is of a material that changes shape in response to the temperature of the coolant fluid within the chamber so as to effect movement of the valve member between its closed and open positions;

Still further, in accord with this disclosure, a cooling system for use with computer processors is disclosed for maintaining the operating temperature of each of a multiplicity of processors (heat sources) to be within a predetermined operating temperature range for each processor. The heat sources are arranged in n rows $R_1$-$R_n$ where n is an integer greater than or equal to 1, where there are p processors in each row where p is an integer greater than or equal to 1, and where the number of heat sources in each row may vary from row-to-row. Each heat source has a control valve associated with it for controlling the flow of coolant fluid to its respective heat source. Each control valve has housing with a chamber therein, the chamber having an inlet in communication with its respective heat source such that the temperature of the coolant fluid in the chamber reflects the temperature of its respective heat source. The chamber has an outlet. A valve member is disposed in the chamber and is responsive to changes in temperature of the coolant fluid in the chamber for effecting movement of the valve member between a closed position in which the valve member substantially blocks the flow of coolant fluid from the chamber and hence from its heat source and an open position in which the coolant fluid in the chamber may flow from the chamber via the outlet so that additional coolant fluid may flow into its respective heat source thereby to further cool the heat source. The valve member is of a material that changes shape in response to the temperature of the coolant fluid so as to effect movement of the valve member between its closed and open positions;

A method of the present disclosure is described for cooling a multiplicity of processors (heat sources) in a data center or the like. A supply of coolant fluid is in communication with each the heat sources. A control valve is provided for each of the processors, where each control valve has housing with a chamber therewithin. The chamber has an inlet for receiving coolant fluid from its respective the heat source such that the temperature of the coolant fluid in the chamber reflects the temperature of the heat source associated with the control valve and an outlet for the discharge of coolant fluid from within the chamber. The control valve has a valve member that is responsive to changes in the temperature of the coolant fluid within the chamber to effect movement of the valve member between a closed position in which the flow of coolant fluid from within the chamber is substantially blocked and an open position enabling the flow of fluid from the chamber via the outlet. The method of this disclosure comprises a step of permitting a minimum flow of coolant fluid from within the chamber of a control valve such that when the valve member of the control valve is in its closed position this minimum flow of coolant to the processor maintains the processor within its respective predetermined operating temperature range. When the temperature of the coolant fluid within the chamber exceeds a predetermined first temperature, this change in temperature effects movement of the valve member from its closed position toward its open position thereby permitting more coolant fluid to flow to its respective heat source so as to maintain the latter within its desired range of operating temperatures.

Other objects and feature of the present disclosure will be in part apparent and in part disclosed hereinafter to those skilled in the art.

DESCRIPTION OF THE DRAWINGS

FIG. 2 is a schematic showing how a plurality of heat sources, such as a multiplicity of processors or other heat producing electronic components (e.g., computer microprocessors) in a data center, where each heat source is independently cooled by a respective control valve of the present disclosure associated with each heat source in a manner as will be herein described in accord with the method of the present disclosure;

Corresponding reference characters indicate corresponding parts throughout the several views of the drawings of this disclosure.

DESCRIPTION OF PREFERRED EMBODIMENTS

Figure 1:
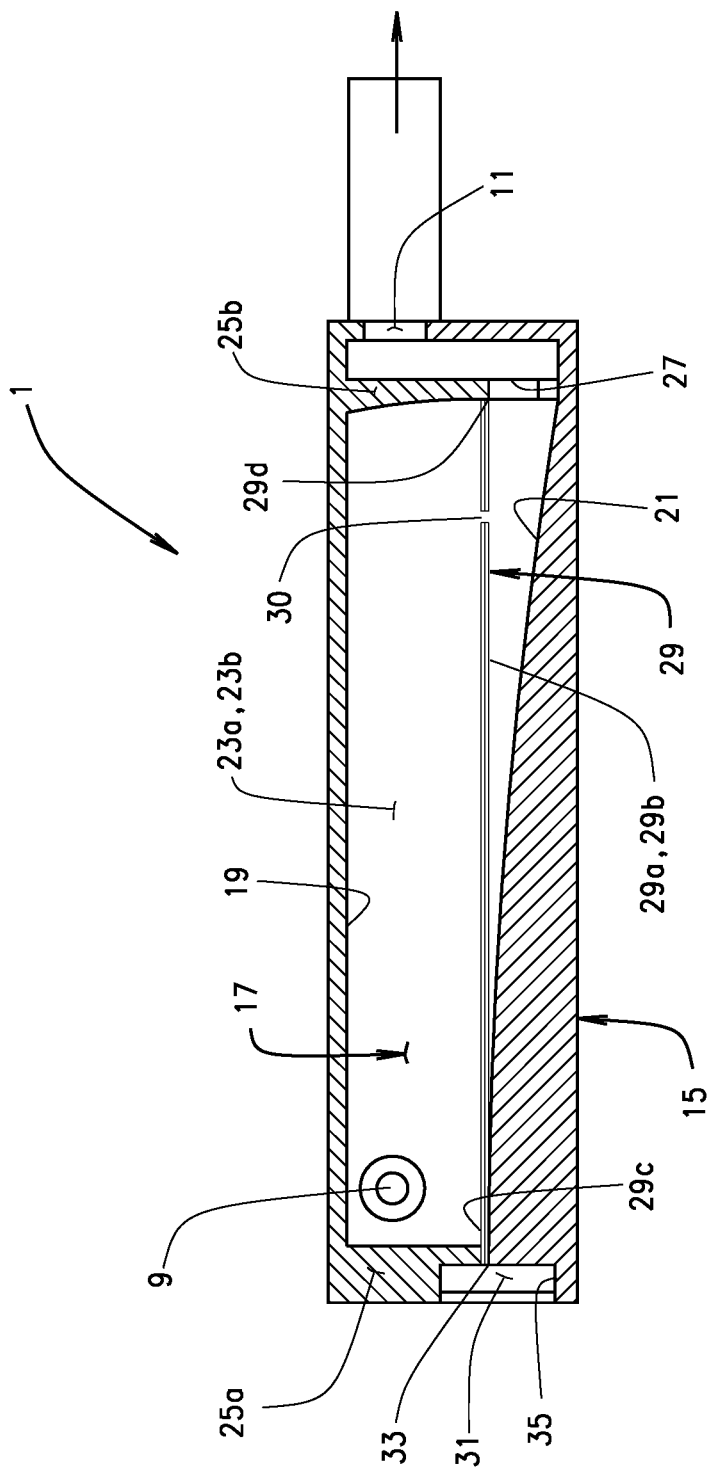
FIG. 1 is a longitudinal, vertical cross section of a computer system control valve in accord with the present disclosure having a valve member movable between a closed and an open position in response to changes of temperature of an operating fluid within the control valve.

Referring now to FIG. 1, a computer system control valve, which may also be known as a Passive Temperature Gate (PTG), of the present disclosure is indicated in its entirety at 1. In accord with this disclosure, control valve 1 may serve as a control valve for the "on demand" supplying of an influent (e.g., an operating fluid, such as a coolant fluid or a heating fluid) to a respective heat source 3 if the system is a cooling system or a respective heat sink 3 if the system is a heating system. However, the term "heat source" is used in this disclosure to mean either a heat source that is being cooled or a heat sink that is being heated. As shown in FIG. 2, the heat source may, for example, be a microprocessor or a processor or other heat producing electronic element 3 in a computer system, and more particularly to a plurality of processors in a data center or the like. Each of the processors 3 may be in heat exchange relation with a respective heat exchanger (not shown, but well known to those skilled in the art), which may, for example, be a finned heat sink or a radiator with flow passages therein for the circulation of the operating fluid through the heat exchanger to cool the heat exchanger and thus to cool the processor. Of course, such a radiator may have an inlet and an outlet for the flow of the operating fluid therethrough.

As used in this disclosure and in the claims, the term "heat source" refers to an element of a computer system that generates heat and that may or may not have a heat exchanger in heat transfer relation therewith. However, it will be understood that in certain cooling applications, the system of the present disclosure may directly cool a heat source without the need for a heat exchanger. Further, while the system of the present disclosure is described as cooling a plurality or a multiplicity of heat sources, it will be understood that the control valve 1 of the present disclosure may be used to control the temperature of a single heat source. The term "plurality" is generally understood to mean "more than one" and the term "multiplicity" is generally understood to mean "a great number". However, there is considerable overlap between the two terms such that if the term "plurality" is used in the claims in relation to the term heat source, it would not preclude there being a large number (a multiplicity) of heat sources.

More specifically, a control valve 1 of the present disclosure will automatically operate to increase or decrease the flow of the operating fluid, such as a cooling or heating fluid, to its respective heat source 3 if employed in a cooling system as shown in FIG. 2 or if employed in a heating system (not shown, but also similar to FIG. 2) in response to the temperature of the heat source increasing or decreasing above or below a first predetermined temperature T1, at which temperature the control valve will begin to open (or to close) so as to maintain the temperature of the heat source within a predetermined range of operating temperatures. Of course, the increase or decrease of the flow of the operating fluid supplied to a heat source 3 will vary in real time in response to the cooling or heating demand (or heat output) of its respective heat source. In this manner, a control valve of the present disclosure will substantially instantaneously (within a few seconds) increase or decrease the flow of the operating fluid to its respective heat source in response to the "on demand" cooling or heating requirements of its respective heat source. In this manner, the temperature of the source 3 can be automatically maintained within a desired or predetermined range of operating temperatures so as to insure that the source 3 will operate as it was intended and so that the source will not overheat or will not be unduly cooled. By "on demand" it is meant that the flow of operating fluid to a heat source will automatically be increased or decreased substantially in real time in response to an increase or a decrease in temperature of the operating fluid that reflects an increase or decrease in the heat load output or temperature of the heat source.

As explained above, a control valve of the present disclosure can function to heat or cool a heat source 3 so as to maintain operation of the heat source within a desired temperature range. Throughout the remainder of this disclosure, the control valve and system S (as hereinafter described) of the present disclosure will be described as functioning as cooling system, but it will also be understood that the control valve and the system S can also operate as a heating system.

Referring now to FIG. 2, it will be seen that system S shown therein is a cooling system that has one or more rows of heat sources 3 (such as a processor that may or may not have a heat exchanger 5 associated therewith). More specifically, FIG. 2 illustrates that the system S may have "n" rows $R_1$-$R_n$ of such heat sources (where n is an integer≥1), and there may be "p" heat sources $3_1$-$3_p$ and "p" control valves $1_1$-$1_p$ in each row (where p is an integer≥1), but where the number of heat sources in each row may vary from row-to-row. Each heat source 3 has a respective control valve 1 of the present disclosure in operating relation therewith in a manner as will be described. In this manner, many heat sources 3 may be individually maintained within a desired or predetermined operating temperature range for each heat source. As noted, in FIG. 2 the heat sources may be processors in a computer system or data center, and a data center may have thousands of microprocessors or other electronic components (heat sources 3) that must be cooled or heated so that the temperature of each heat source is maintained within its desired operating temperature range. Each heat source 3 is connected to a supply of operating fluid, typically a cooling fluid that is maintained at a desired temperature and pressure. The supply of such operating fluid may be supplied by a supply manifold 7, as shown in FIG. 2. When operating as a cooling system, the operating fluid (influent) flows from supply manifold 7 through each heat source 3 for cooling the heat source, and the heated operating fluid (effluent) from each heat source is directed to an inlet 9 of its respective control valve 1. The operating fluid flows through its respective control valve 1 from its inlet 9 to its outlet 11 and then to a return manifold 13 in a manner as will be described in detail hereinafter.

It will be appreciated that the supply and return manifolds 7 and 13 are designed to supply a desired quantity of the operating fluid (influent) to each heat source 3 (or its respective heat exchanger 5) so as to adequately cool each heat source/heat sink 3 and to carry away the heated cooling fluid (effluent) from each heat source. While any conventional cooling system may be used in conjunction with the system of this disclosure, a cooling system, such as described in the above-mentioned U.S. Patent Publication 2017/0241675, which is incorporated by reference herein, using a supercritical $CO_2$ (sometimes referred to as "$sCO_2$") as the effluent (cooling fluid) may be preferred to cool the heat sources 3, as shown in FIG. 2, which will described in greater detail hereinafter.

In such a system as illustrated in FIG. 2, it will be appreciated that each control valve 1 will automatically operate to control the temperature of its respective heat source 3 to be within a desired or predetermined range of operating temperatures solely in response to the increase of decrease of the temperature of the operating fluid within the control valve, which reflects the temperature of its respective heat source. Preferably, and in accord with the instant disclosure, control valve 1 maintains a low flow rate of the operating fluid from the heat source, even when the operating valve is in its closed position, so as to insure that the temperature of the operating fluid in chamber 17 reflects the operating temperature of its heat source 3 and so as to provide some cooling for the heat source when its heat output is low, such as when a processor is idling, so as to maintain the operating temperature of the heat source within its desired operating temperature range. Because the control valve is preferably located in close proximity to the heat source, and because the temperature of the operating fluid within the control valve is closely approximates or reflects to the temperature of the heat source 3, the control valve 1 of the present disclosure will automatically maintain the heat source within a desired range of operating temperatures without the need for an active control system, which may require sensors, a computer control system, remotely operated valves or the like in order to operate. Moreover, each of the control valves 1 of the present disclosure in the system S, as shown in FIG. 2, will operate independently of one another to control only its respective heat source such that each of the heat sources shown in FIG. 2 may be controlled to operate at the same or at different ranges of operating temperatures. This can be accomplished by selecting control valves that operate at different temperatures.

Referring now to FIG. 1, a control valve 1 of the present disclosure is shown to comprise a housing 15 having a chamber 17 therewithin. The chamber has in inlet 9 for receiving effluent (e.g., an operating fluid that has been heated or cooled by its respective heat source 3). The effluent fills chamber 17 and will flow out of housing 15 via outlet 11 to the return manifold 13, as shown in FIG. 2, when the control valve is open. Chamber 17 preferably has an upper wall 19, a bottom wall 21, spaced sidewalls 23a, 23b, and respective proximal and distal end walls 25a, 25b. At the lower end of distal end wall 25b, an outlet orifice 27 is provided, which is in communication with chamber 17 and outlet 11. As shown in FIG. 1, bottom wall 21 and distal end wall 25b are preferably curved for purposes as will appear. As shown in FIG. 1, chamber 17 has a generally rectangular cross section, but it will be appreciated that chambers of other cross sections, such as circular or elliptical, may be used within the present disclosure.

In accord with control valve 1 of the present disclosure, an operating valve member, as generally indicated at 29, is mounted within chamber 17 for movement in response to changes of temperature of the operating fluid contained within the chamber between a closed position (as shown in FIG. 1) and a fully open position. The valve member 29 is preferably in the shape of an elongate rectangular strip having side edges 29a, 29b, a proximal end 29c which is preferably fixedly cantilever supported with respect to end wall 25a of housing 15, and a free distal end 29d. However, within the broader aspects of this disclosure, valve members of other shapes may be used. When valve member 29 is in its closed position, the distal end 29d of the valve member is above orifice 27 such that the valve member substantially blocks the flow of fluid through chamber 17 to orifice 27. When the valve member 29 is in its fully open position (not shown in FIG. 1), the distal end 29d of the valve member is below orifice 27 such that the flow of fluid from chamber 17 to outlet 11 through the orifice is substantially unimpeded by the valve member. As noted, housing bottom wall 21 is preferably curved such that it matches the curvature of the valve member 29 as the latter moves or flexes between its closed and open positions, and as the valve member flexes above its closed position. With the valve member 29 in its fully open position, the distal end 29d of the valve member is positioned below the bottom of orifice 27 so that it does not interfere with fluid flowing through the orifice.

Valve member 29 is a member that changes shape in response to changes in temperature of the fluid within chamber 17. As will be described in greater detail hereinafter, the temperature of the fluid within chamber 17 causes the valve member to flex in response to the heat output (an increase in temperature) of heat source 3. For example, valve member 29 is preferably of a "bimetal" material that changes shape in response to changes in temperature of the operating fluid in chamber 17, which, in turn, reflects increases or decreases of the temperature of its respective heat source 3.

As noted above, valve member 29 is preferably a strip having a generally rectangular shape, when viewed in plan, and is sized relative to chamber 17 such that its side edges 29a, 29b have a substantially sliding, sealing fit with a respective chamber side wall 23a, 23b, and such its distal end 29d has a substantially sliding, sealing fit with the inner face of chamber distal end wall 25b as the valve member flexes between its closed and open positions. As shown in FIG. 1, the proximal end 29c of valve member 29 is fixedly cantilever supported with respect to the proximal end wall 25a of housing 15. While the valve member may be fixedly cantilever supported in any number of ways with respect to housing 15, a presently preferred way would be to sealingly affix a block or plug 31 to the proximal end 29c of the valve member 29 and to insert the blade-like valve member 29 into chamber 17 through a slit 33 in a cavity 35 in the proximal end wall 25a of housing 15 such that the distal end 29d of the valve member slidably, sealable engages the inner face of chamber end wall 25b. The block 31 fits snugly within a cavity 35 in housing 15 and may then be securely sealed in place by any suitable means.

Valve member 29 has a normal closed position (as illustrated in FIG. 1) within the chamber 17 such that the distal end 29d of valve member 29 is above the level of outlet orifice 27 so as to substantially block the flow of fluid from within the chamber to outlet 11 when the temperature of the fluid within the chamber is at or below a first predetermined temperature T1. If the temperature of the operating fluid within chamber 17 is higher than the first temperature T1, the bimetal valve member 27 will flex downwardly (as the control valve is illustrated in FIG. 1) from its normally closed position toward its fully open position. As previously noted, the inner face of end wall 25d is preferably curved so as to substantially match the curved path of the distal end 29d of the valve member 29 as it moves up and down within the chamber so that the distal end of the valve member remains in sliding sealing relation with the inner face of end wall 25d. It will also be noted that bottom wall 21 is preferably curved so that it will substantially match the curvature of valve member 29 when the latter is sufficiently heated that it is in its fully open position.

With valve member 29 in its closed position, it will be understood that, preferably, there is some "leakage" of the operating fluid from within chamber 17 around one or more edges of the valve member such that a low flow rate of the operating fluid will flow from each heat source 3 to its respective control valve 1 and through the control valve to outlet 11 even when the valve member is in its closed position. Alternatively, one or more metering openings, as indicated at 30, may be provided in valve member 29 to allow a predetermined low flowrate of the operating or coolant fluid from the upper side to the lower side of the valve member when the valve member is in its closed position. This low flowrate of coolant fluid is preferably sufficient to maintain the heat source within its desired operating temperature range when the heat output of the heat source is low and hence when the demand for cooling is not high, but where the heat source nevertheless continuously receives at least some cooling fluid so as to maintain the heat source within its desire range of operating temperatures. In this manner, a control valve 1 of the present disclosure may be operated to cool its respective heat source so as to insure that the heat source, such as a processor, is not overheated while it is in its idling or in a low usage state.

Upon heat source 3 beginning to output additional heat, as may be occasioned upon a processor being operated at a state above its idling state, it will produce additional heat, which, in turn will raise the temperature of the operating (coolant) fluid flowing through the heat source and entering chamber 17 of its respective control valve 1. When the temperature of the operating fluid within chamber 17 increases above temperature T1 in response to increased heat output of heat source 3, this increased temperature will be reflected in the temperature of the operating fluid in the chamber 17. This increased temperature in the chamber will cause the bimetallic valve member 29 to deflect or flex downwardly from its closed position, as it is shown in FIG. 1, so that the distal end 29d of the valve member will move below the upper edge of outlet orifice 27 thereby permitting increased flow of the operating fluid (coolant) from the supply manifold 7, as shown in FIG. 2, through heat source 3 and through the control valve 1 to the return manifold 13. Of course, this increased flow of influent (cooling fluid) will provide additional cooling to the heat source 3. As the heat output of heat source 3 further increases, the temperature of the effluent (e.g., warmed cooling fluid) supplied to the inlet 9 of the control valve will further increase, which, in turn, further increases the temperature of the fluid within chamber 17. In response to this increased temperature of the fluid within chamber 17, valve member 29 is caused to deflect further downwardly thus progressively uncovering more of outlet orifice 27 until the full cross-sectional area of the outlet orifice is open to the flow of fluid to outlet 11. If the heat output of the heat source decreases, the temperature of the effluent cooling fluid admitted into chamber 17 will also decrease. This decreased temperature of the operating fluid in the chamber will cause the bimetallic valve member 29 to deflect in the opposite direction (upwardly as shown in FIG. 1) thereby to progressively block the flow of fluid through orifice 27. As the temperature of the effluent supplied to chamber 17 decreases to temperature T1 or below, the valve member will be in its fully closed position thereby to substantially block the flow of fluid from heat exchanger 5. If the temperature in the chamber is below temperature T1, the distal end of the valve member may flex further upwardly from its fully closed position, as shown in FIG. 1. Due to the curved shape of the inner face of distal end wall 25b, the distal end 29d will remain in sliding, sealing engagement with the distal end wall even if the temperature of the fluid within chamber 17 is below temperature T1.

As previously noted, a "bimetal" strip is preferably used as valve member 29 to convert a temperature change of the fluid within chamber 17 into mechanical displacement or movement (flexing) of the distal end 29d of the strip-like valve member relative to orifice 27 to effect movement of the valve member between its closed and open positions. The bimetal strip constituting valve member 29 typically may have two, three, or more layers of different (dissimilar) metals each having a different coefficient of thermal expansion, as compared to its adjoining strips, so that as the valve member is heated or cooled, the layers expand and contract at different rates. The layers are preferably joined together in face-to-face relation throughout their length, such as by riveting, brazing, explosion bonding, welding or any other suitable process well known to those skilled in the art. The different rates of thermal expansion of the dissimilar layers are selected so that the strip will bend downwardly, as shown in FIG. 1, when it is heated to a temperature greater than temperature T1 so as to move valve member 29 from its closed position toward its open position. Of course, with the valve member so flexed below its closed position (i.e., in a partially or fully open position), upon the temperature of the fluid in chamber 17 decreasing, the valve member will flex in the opposite direction toward its closed position. If such flexing of the valve member is desired, the metal layer with the higher coefficient of thermal expansion will be positioned on the upper side (as shown in FIG. 1) of the valve member so that as the valve member is heated, it will curve or flex downwardly. Of course, as the valve member is cooled, it will flex in the opposite direction. In this way, the distal end 29d of the valve member 29 is caused to move from its closed position toward its fully open position upon the temperature of the fluid in chamber exceeding temperature T1, as may be occasioned by the heat source 3 generating more heat thus requiring additional cooling. In this manner, control valve 1 is self-regulating to control flow of coolant to its respective heat source so as to maintain its heat source to be within its desired predetermined range of operating temperatures. As noted, when the temperature of the operating fluid within chamber 17 increases to (or above) a second operating temperature T2, the orifice 27 is fully open. The difference between temperatures T1 and T2 establish the range of operating temperatures for a respective heat source. By changing the characteristics of the bimetal valve member 29, the operating temperature range of a heat source may be varied.

The desired flexure of the bimetal valve member 29 may be achieved by any combination of the valve member parameters including, but not limited to, its length, the number of layers and the type of metal of each layer, the thermal expansion coefficient of each layer, the length of the different layers and whether the layers are staggered, thickness (total and for each layer), width, and composition of each layer. In this manner, the flexivity (flexible characteristics) of valve member 29 may be defined such that the valve member flexes a predetermined amount for each unit of temperature difference between its first temperature T1 and its second temperature T2. Further, valve member 29 may be pre-stressed to a predetermined level to allow for variations of ambient temperature compared to the in-service temperatures so as to insure that the valve member will flex its desired amount when it is subjected to its intended operating temperature difference between temperatures T1 and T2. Further, it is desirable that the flexure of the valve member 29 be predictable and repeatable when it is exposed to multiple operating cycles, namely, changes in temperature between temperatures T1 and T2.

Those skilled in the art will recognize that if the system S is to be operated as a heating system rather than a cooling system, the bimetal valve member 29 may be selected and oriented within chamber 17 so that it will admit more or less of the operating fluid to the heat source so as to heat the heat source and to maintain it within its desired operating range.

Those skilled in the art will recognize that in a cooling system S, as shown in FIG. 2, each control valve 1 may be selected so as to control the temperature of its respective heat source 3 to be in a predetermined operating range for that heat source. Further, it will be appreciated that not all of the heat sources 3 need have the same range of operating temperature.

Any fluid may be used as the operating fluid. However, $CO_2$ (in its liquid or supercritical state as it passes through a heat source 3) is a preferred influent operating fluid. There are minimum temperatures and pressures above which supercritical $CO_2$ must be maintained to insure that the supercritical $CO_2$ is in its supercritical state as it passes through the heat sources. In practice, supercritical $CO_2$ is maintained at temperatures and pressures substantially above its supercritical temperature and pressure, as described above. For example, a typical operating range for $CO_2$ in a cooling system of the present disclosure may have a temperature range from about 25° C.°-100° C. and a pressure ranging between about 80-100 bar. Of course, other operating fluids would have different operating temperatures and pressure, which would be known to one of ordinary skill in the art. For example, distilled water should be maintained between about 0° C. (32° F.) and 100° C. (212° F.) and at near atmospheric pressures.

There are several benefits from using supercritical $CO_2$ (also referred to as "$sCO_2$") as an operating fluid in a cooling, heating or power cycle. First, it will be noted that the specific heat capacity of $sCO_2$ is theoretically infinite at the exact supercritical point conditions. Specific heat capacity, sometimes referred to as merely specific heat, is the amount of heat energy required to raise or lower the temperature of a substance per unit of mass. While it is not desirable or practical to operate a system at this critical point of $sCO_2$, the specific heat of $sCO_2$ near, but somewhat above the critical point is still very high compared to normal process or operating fluids such as air, steam, or conventional refrigerants commonly used in cooling/power loops. The use of $sCO_2$ as the operating fluid with its relatively a high specific heat capacity means that significant energy can be removed from or delivered to a suitable heat source requiring a relatively small amount of fluid flow (as compared to other operating fluids, such as water, steam, or common refrigerants) without resulting in large temperature changes of the operating medium. The lower flow rate required results in reduced power consumption for pumping the flow around the process loop.

Further, the high specific heat of $sCO_2$ retards or minimizes the change in temperature of the operating fluid, as compared to other operating fluids, such as noted above. This minimal temperature rise reduces the rate of density decay of the working medium allowing for a reduction in power consumption to pump the operating fluid around the system. In other words, $sCO_2$ is easier to pump/compress because it is denser than a low density gas, such as air.

Moreover, the high specific heat and high density associated with $sCO_2$ result in a high power density system allowing for process components, such as the turbine/pump used to circulate the $sCO_2$ around the system S to be smaller in physical size and subsequently lower cost when compared to components operating in classical mediums (e.g. water/steam/Freon). With appropriate process parameters, the unique fluid properties of $sCO_2$ allows for higher thermodynamic efficiencies when compared to the classic steam/water Rankine cycle of single phase Brayton cycle. The density change resulting from a phase change of an operating or working fluid causes disruptions in process flow, heating, cooling, stability and controls. The density variation when changing from liquid $CO_2$ at pressures above the supercritical pressure to supercritical $CO_2$, upon the addition of heat, is much less than the density variation associated with commonly used operating fluids that switch between a liquid state to a vapor state. This reduced variation in density allows for a more stable operating system. For periods of operation when $sCO_2$ is the influent in a system, such as system S as shown in FIG. 2, the heat transfer takes place in a simple single phase manner (e.g., sensible heat transfer only, where sensible means changes in temperature) compared to other processes that must accommodate the latent heat associated with phase changes. The supercritical point for $sCO_2$, about 73 bar and about 31° C., is relatively low and easy to accommodate when compared to other mediums (e.g., water's critical point is about 218 bar and about 374° C.) thus allowing for $sCO_2$ to be applied to lower temperature applications (e.g., temperatures below about 200° C.) while still maintaining reasonable efficiencies. Further, it will be noted that if $sCO_2$ is used and if there is a leak, the leakage of $CO_2$ is not toxic (assuming that there is sufficient ventilation) and will not damage critical components being cooled, as may be the case if water is used and if a leak develops.

If supercritical $CO_2$ is used for the operating fluid in the system S using one or more control valves 1, the first temperature T1 at which temperature the valve member 29 begins to flex downwardly toward its fully open position may be, for example, about 90° C. and the operating pressure may be about 90 bar. As the temperature of the fluid within chamber 17 rises above the temperature T1 in response to its respective heat source 3 outputting additional heat, the bimetal valve 29 will flex downwardly (as it is viewed in FIG. 1) so that as the distal end 29*d* of the valve will begin to uncover the upper reaches of orifice 27. In this manner, control valve 1 enables an increase in flow of the operating fluid from the chamber 17 to outlet 11. As the temperature of the fluid within chamber 17 further increases above the temperature T1 the distal end of the valve member 29 will progressively move downwardly with respect to the orifice 27 until the full cross section of the orifice is uncovered and the maximum flow of fluid through the orifice is permitted. With the full cross section of the orifice uncovered, the valve member is in its fully open position.

Referring now to the above mentioned U. S. Patent Application Publication 2017/0241675 (the "'675 Publication"), which is incorporated by reference herein, and more particularly referring to FIG. 1D of the '675 Publication (which is reproduced as FIG. 4 herein), the heat exchanger 102, may, for example, be a plurality of heat sources 3 (e.g., a plurality of processors), which may or may not have a respective heat exchanger in heat transfer relation therewith. The system S of FIG. 2 may be incorporated in the system 100 shown in FIG. 4 in place of the heat exchanger 102 so that a large number (e.g., a plurality or a multiplicity) of heat sources 3 may be cooled by system S. In such case, the high pressure piping 114 downstream from the compressor 110 is connected to supply manifold 7 of the system S so that the operating fluid flows to heat sources 3 and is controlled by the control valve 1 associated with each of the heat sources 3 in the manner above described such that each of the heat sources 3 may individually be controlled or regulated to be within a predetermined range of operating temperatures (or controlled not to exceed a predetermined maximum temperature). The outlet 11 of each of the control valves 1, as shown in FIG. 2, is connected to return manifold 13, which, in turn, is connected to the high pressure piping 114 downstream of the heat exchanger 102. In this manner, operating fluid may be supplied to each of the heat sources 3 from compressor 110, circulated through each of the heat sources 3 and through its respective control valve 1, and through expander/turbine 108, and then returned to condenser 112 and then to compressor 110 to be recirculated again.

Figure 4:
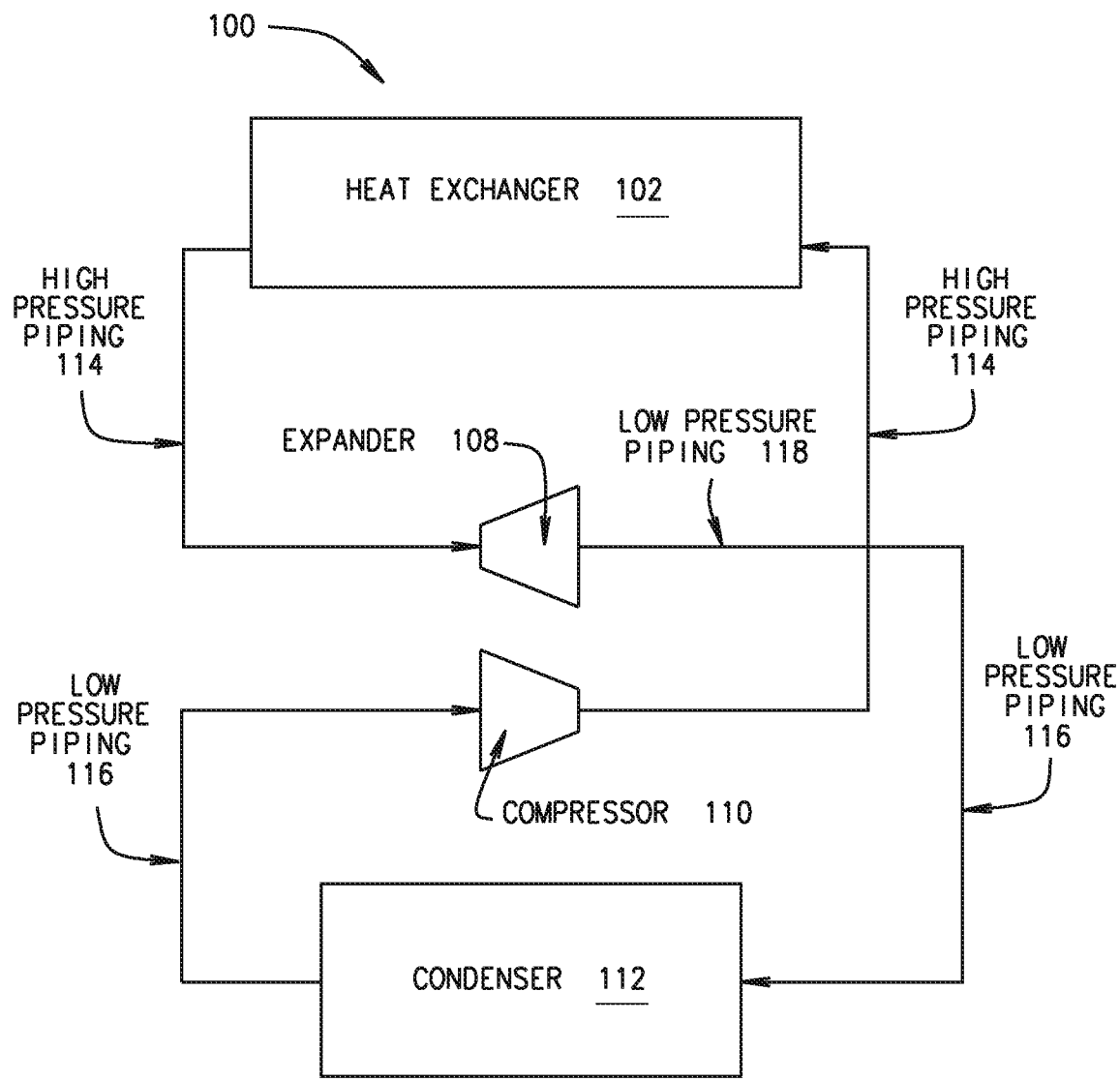

Further, if the operating fluid of the system shown in FIG. 4 (i.e., the system shown in FIG. 1D of the above-noted '675 Publication) is $CO_2$, and preferably supercritical $CO_2$, it will be appreciated that the state of the operating fluid at each point in system S is not only a function of the condition of the operating fluid at any point in the operating system, but is also a function of the ambient temperature of that point in the system. For example, certain components of the system of FIG. 4 (e.g., the compressor 110 and the condenser 112) may be located out of doors so that these components operate more efficiently or to isolate noise from within a building. In such circumstances, the operating fluid leaving the compressor 110 may be sub-cooled liquid $CO_2$ due to moderately cold outdoor ambient temperature (e.g., about 55° F. or below). This sub-cooled liquid $CO_2$ exiting the compressor 110 may be elevated to a pressure greater than the supercritical pressure of $CO_2$, but yet the temperature of the $CO_2$ (due to the low ambient temperature) is still lower than the supercritical transition point such that the $CO_2$ in the high pressure piping system 114 between compressor 110 and heat exchanger 102 is not yet supercritical until such time as the operating fluid is heated, either by the ambient temperature or by the heat sources 3 later in the process loop.

However, on a hot summer day when the ambient outdoor air temperature is, say, 80-90° F. or more, and preferably about 80° F., the operating fluid flowing from condenser 112 and entering the inlet of compressor 110 may already be in a supercritical state such that the compressor simply elevates the working pressure of the fluid for distribution around the process loop. The process loop may, when the system S of FIG. 2 is incorporated in the system of FIG. 4 in place of the heat exchanger 102, include the operating fluid flowing through the high pressure piping 114 and into supply manifold 7, through heat sources 3, through control valves 3, into return supply manifold 13, and then into high pressure piping upstream of expander or turbine 106. Of course, as the process fluid flows through heat sources 3, heat is recovered or transferred from each heat source to the operating fluid flowing through the heat source such that the operating fluid is heated by the heat source and has potential energy stored therein, and such that each heat source is cooled.

As described above, a respective control valve 1 is associated with each heat source 3 such that each control valve controls or modulates that flow of the operating fluid through its respective heat source 3 in response to increases and decreases of the temperature of the operating fluid flowing from the heat source so as to maintain or regulate the heat source to be within a predetermined range of operating temperatures. Of course, by using supercritical $CO_2$ as the working medium, its advantages, as described herein, are realized.

As shown in FIG. 1D of U.S. Patent Application Publication 2017/0241675 (FIG. 4, here), high pressure supercritical $CO_2$ is delivered to the inlet of an expander 106, which may be, for example, a turbine powered by the high pressure operating fluid. The expander or turbine 106 is driven by the high pressure, high temperature supercritical $CO_2$ such that it generates sufficient power (either electrical power or mechanical power) that it may at least in part or fully power the aforementioned compressor 110 in the manner described in U.S. Patent Application Publication 2017/0241675. In this manner, the heat transferred from heat exchanger 102 (which may be system S having a plurality of heat sources 3, as shown in FIG. 2) may be used to at least in part power the cooling system shown in FIG. 2 of this disclosure. Referring again to FIG. 4 herein, low pressure $CO_2$ exiting the expander or turbine 106 then is supplied via a low pressure piping system 116 to a condenser 112, where the $CO_2$ is cooled and condensed to a lower temperature and pressure $CO_2$. The $CO_2$ exiting the condenser is then delivered via low pressure piping system 116 to the inlet of compressor 110, which compresses the $CO_2$ such that the process repeats. Those skilled in the art will recognize that there is the potential for a change in state of $CO_2$ within the expander or turbine 106 (as shown in FIG. 4), where this is a function of (or dependent upon) the ambient temperature of the expander. For example, on cooler days when the ambient temperature is less than about 32° F., the state of the effluent exiting the expander may be either liquid $CO_2$ or $sCO_2$. It will be appreciated that it is not necessary that the heat of compression in compressor 110 force the $CO_2$ into its supercritical state. It will be further recognized that there is a potential for a change in state of the $CO_2$ within expander 106, which is a function of the ambient temperature of the expander. For example, on cooler days when the ambient temperature is less than about 32° F., the expander effluent may be $CO_2$ in a vapor state and the $CO_2$ is condensed to liquid $CO_2$ in a heat exchanger (not shown in FIG. 4) located between the expander and the inlet to compressor 110. However, at a somewhat higher ambient temperature, for example above about 85° F., the expander $CO_2$ effluent will remain in its supercritical state.

Figure 5:
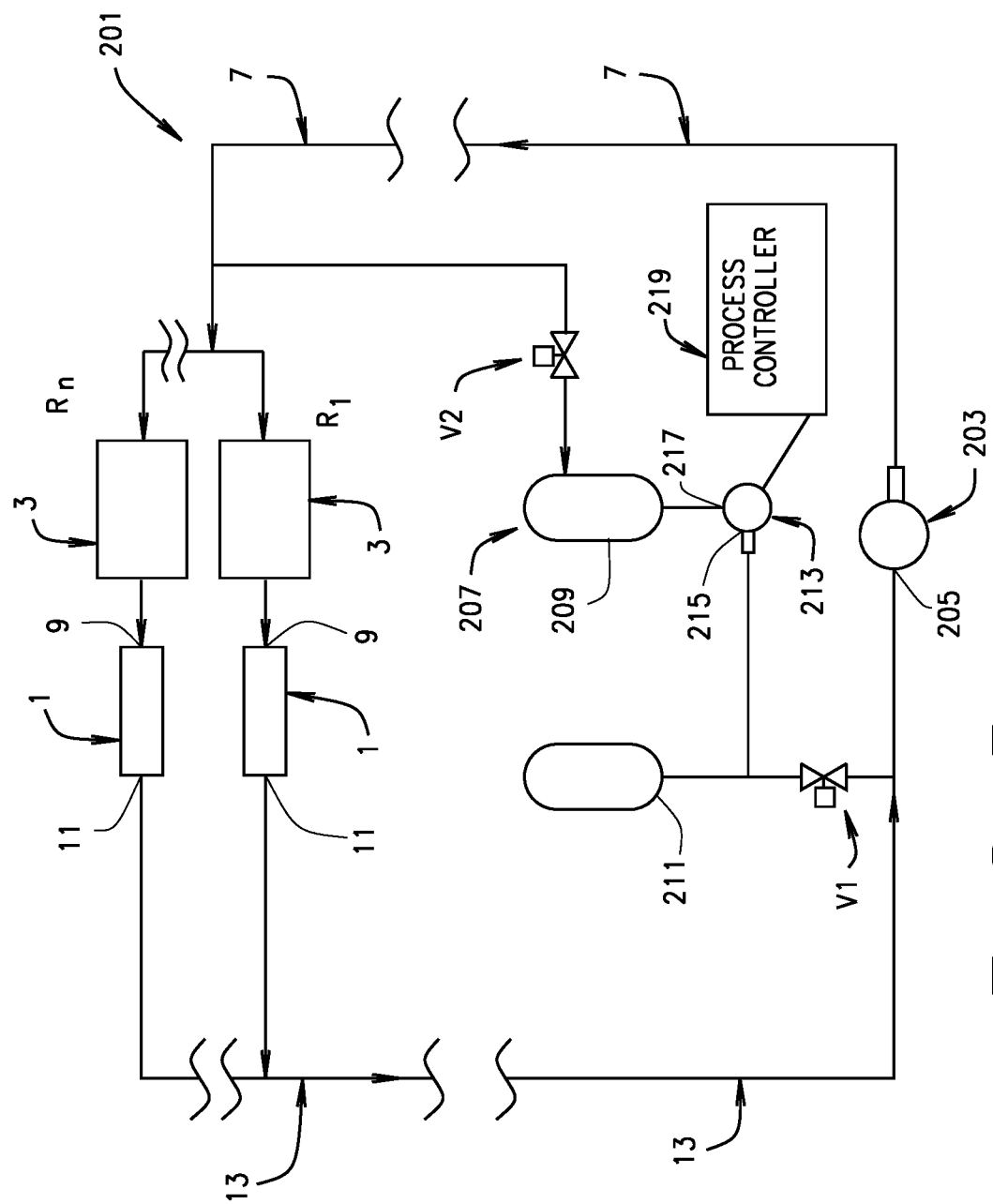
FIG. 5 is a schematic of a cooling system of the present disclosure using the control valves of FIG. 1 and using $CO_2$ as the coolant fluid.

Temperature T2 is the temperature of the operating fluid in chamber 17 when the valve member 29 is in its fully open position. Of course, if the temperature of the fluid within chamber 17 is above temperature T2, the valve will remain in is fully open position, but it is prevented from flexing further downwardly by the curved bottom chamber wall 21. For example, if the desired operating temperature range for valve 1 (i.e., the difference between temperatures T1 and T2, which may sometimes be referred to as "ΔT") would be 5° C., the selection of the bimetal material from which valve member 29 is made may be such that when the temperature of the operating fluid in chamber 17 is 5° C. or more above its temperature T1, the valve will be flexed to its fully open position. If the desired operating temperature range would be 10° C., the bimetal material for valve 29 would be selected to give the desired flexure of the distal end 29d of the valve member so as to fully open the orifice upon the temperature T2 of the operating fluid in chamber 17 being 10° C. or more than temperature T1. It will be appreciated that if the operating temperature range is selected to be 10° C., the valve 1 could be achieved in a smaller sized valve. However, many other operating temperature ranges for T1 and T2 are possible, depending on the characteristics and properties of the bimetal material from which valve 29 is made. One of ordinary skill in the art who is familiar with bimetals could readily select valve members that would satisfactorily operate for a desired temperature range. The small ΔT, as discussed above, is the result of the high specific heat of $sCO_2$ that allows for a lower mass flux which in turn allows for a reduction in equipment sizing and for a lower parasitic electrical consumption for a system as shown in FIG. 4 or 5.

Figure 3C:
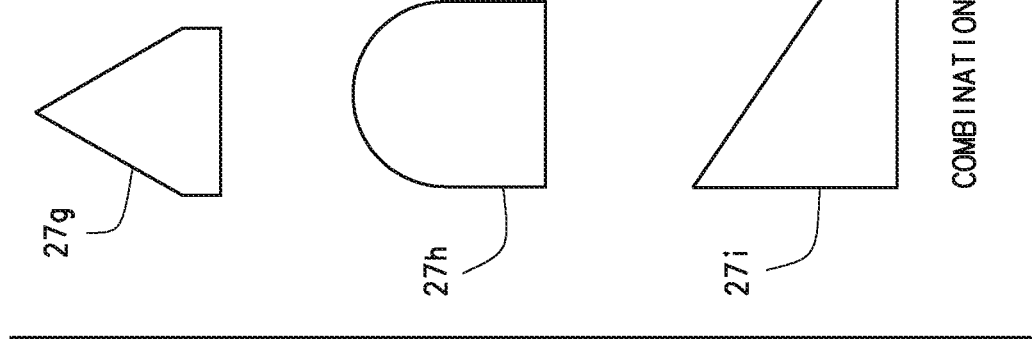
FIGS. 3A-3C illustrate outlet orifices or ports of different cross sections within a control valve of the present disclosure such that increases or decreases of the flow of an operating fluid from the control valve are in linear or non-linear relation to the movement of the valve member in relation to an outlet orifice.
Figure 3B:
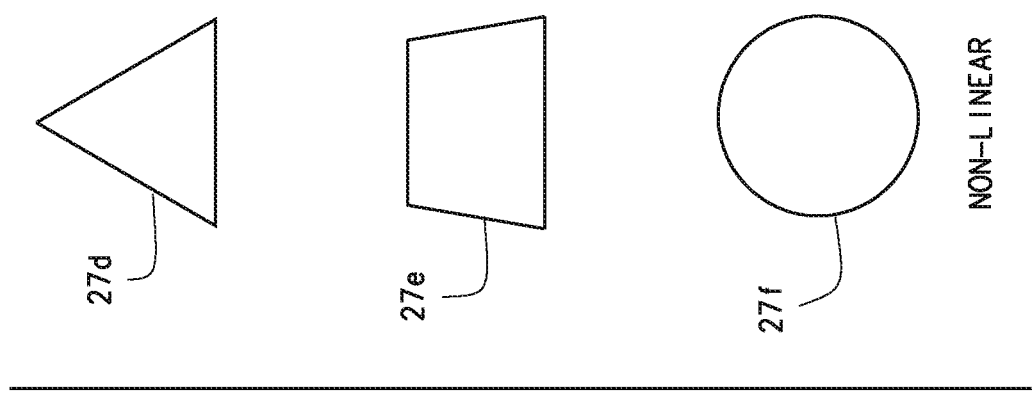
Figure 3A:
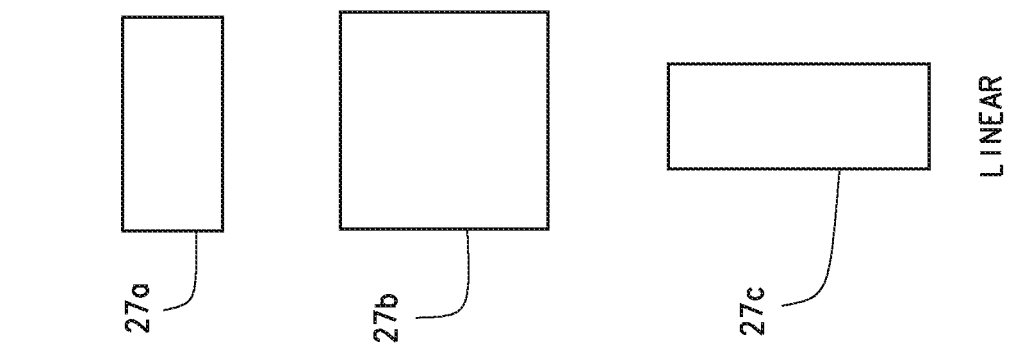

Referring now to outlet orifice 27, its shape may be such that the flow of fluid therethrough may be linear or non-linear in response to flexing of the bimetallic valve member 29 as the valve member moves between its closed and fully open positions. If it is desired to linearly increase or decrease of the flow of fluid through orifice 27 in response to movement of the distal end 29d of the valve member, the shape of the orifice may be such that it's cross-sectional area increases or decreases in a linear manner relative to movement of the end of the valve member. As shown in FIGS. 3A-3C different shapes of the cross-section of different orifices are shown. Orifices 27a-27c, as shown in FIG. 3A, will result in a linear increase or decrease in the flow of the operating fluid in direct proportion of the movement of the valve member between its closed and open positions. These orifices 27a-27c are generally of a rectangular cross sectional shape such that as the distal end of the valve member moves relative to the orifice, a constant amount of cross sectional area of the orifice will be opened or closed for each increment of movement of the distal end of the valve member 29 such that the flow through the orifice will increase or decrease in direct proportion to the movement of the distal end of the valve member. As shown in FIG. 3B, other shapes of orifice 27 are illustrated as orifices 27d-27f, where the increase or decrease in the flow through the orifice increases or decreases in a non-linear fashion as the valve member 29 moves between its closed and open position. As shown in FIG. 3C, combination shapes for the orifice 27 are shown, as indicated at 27g-27i, where the flow of the operating fluid through the orifice increases or decreases in a non-linear fashion over part of the valve member's movement between its open and closed positions and in a linear fashion over another part of the valve's movement between its closed and open positions. The term "linear" will be understood by those skilled in the art to mean that amount of flow through orifice 27 will increase or decrease in direct proportion to the change in position of the valve member relative to orifice 27, which is directly proportional to the difference in temperature of the operating fluid in the chamber relative to temperature T1. Further, the term "non-linear" will be understood to mean that amount of flow through orifice 27 will increase or decrease in a manner that is not in direct proportion to the change in position of the valve member relative to orifice 27. Instead of providing orifices of different cross sections, such linear or non-linear flow of the fluid through the control valve 1 may also be accomplished by providing a bimetal valve member that does not proportionally move in response to changes in fluid temperature.

A method of the present disclosure is especially useful for cooling a multiplicity of processors (heat sources) in a data center or the like. As shown in FIG. 2, supply of coolant fluid is in fluid communication with each heat source or processor 3 by means of the supply manifold 7. A control valve 1 is provided for each of the processors 3, where each control valve has a housing 15 with a chamber 17 therewithin. The chamber has an inlet 9 for receiving coolant fluid from its respective processor 3 (or heat source) such that the temperature of the coolant fluid entering the chamber reflects the temperature of its respective processor and an outlet 11 for the discharge of coolant fluid from within the chamber. The control valve has a valve member 29 that is responsive to changes in the temperature of the coolant fluid within the chamber 17 to effect movement of the valve member between a closed position in which the flow of coolant fluid from within the chamber is substantially blocked and an open position enabling the flow of fluid from the chamber via the outlet 11. The method comprises a step of permitting a minimum flow of coolant fluid from within the chamber 17 of control valve 1 when the valve member is in its closed position such that a minimum flow of coolant is supplied to a respective heat source 3 when the valve member 29 is in its closed position so to supply a minimum amount of cooling to the processor when the heat output of the processor is minimal and so that the temperature of the coolant fluid entering the chamber reflects the temperature of the processor associated with the control valve. When the temperature of the coolant fluid within the chamber exceeds a predetermined first temperature T1, this temperature change effects movement of the valve member from its closed position toward its open position thereby permitting more coolant fluid to flow to its respective processor so as to maintain its respective processor within a desired range of operating temperatures.

Further in accordance with the present disclosure, as previously noted, a preferred coolant fluid is $CO_2$. In accord with the system and method of the present disclosure, it has been found that the $CO_2$ coolant fluid need not be above its critical point at all locations around the process loop, as shown in FIG. 2, 4 or 5. Rather, as previously noted, the physical state of the $CO_2$ coolant fluid (whether it is in its liquid, vapor or supercritical state) is a function of the location of the coolant fluid within the process loop and the ambient air temperature surrounding the location of the coolant fluid in the process loop. The temperature of the $CO_2$ coolant fluid in the process loop may be raised above its supercritical temperature as the $CO_2$ coolant fluid flows through each of the heat sources 3, as shown in FIGS. 2 and 4. It has been found that it may not be necessary to actively raise or elevate the pressure of the $CO_2$ coolant fluid at each location in the control loop in accord with the method of the present disclosure, but rather the pressure in the whole process loop may be controlled. The process loop, as shown in FIG. 2, comprises the flow of the coolant fluid (preferably $CO_2$) via supply manifold 7, through heat sources 3, and then to return manifold 13. The process loop, as shown in FIG. 4, comprises the flow of coolant fluid (again, preferably $CO_2$) from compressor 110 to heat exchanger 102 via high pressure piping 114, through heat exchanger 102 (which may be a plurality of heat sources 3 and control valves 1, as shown in FIG. 2), from heat exchanger 102 to expander 104 via high pressure piping 114, to condenser 112 via low pressure piping 114, and then to the inlet of compressor 110.

The pressure within such a process loop may be maintained by external controls including, but not limited to, a mass inventory accumulator system, as will be hereinafter described.

Referring now to FIG. 5, an exemplary cooling system or process loop in accord with the present disclosure is shown and is indicated in its entirety at 201, which may optionally have a mass inventory system as will be hereinafter described. This system 201 uses $CO_2$ as the preferred coolant fluid for cooling a plurality of heat sources 3 where the flow of coolant fluid to each of the heat sources is controlled by a respective control valve 1, as shown in FIG. 2, so as to maintain the temperature of each heat source 3 to be within a predetermined operating temperature range for that heat source. A main pump 203 (which corresponds to compressor 112 shown in FIG. 4) supplies high pressure $CO_2$ via supply manifold 7 to a plurality of heat sources 3. As shown, there may be a plurality of rows $R_1$-$R_n$ of heat sources 3 with each row having a plurality of heat sources 3, such that the flow of coolant fluid to each of the heat sources is controlled by a respective control valve 1 in the manner of FIG. 2.

In order to minimize the electrical power demands for main pump 203, it is desirable for the coolant fluid (or working medium), preferably but not necessarily $CO_2$, to be either in its liquid state or supercritical state at the pump inlet 205. In order to insure that the $CO_2$ coolant fluid is in its liquid or supercritical state at inlet 205 of main pump 203, on cold/cool days when the ambient air temperature surrounding the pump inlet is below the supercritical temperature of the $CO_2$ coolant fluid (i.e., such that the $CO_2$ coolant fluid at the pump inlet 205 is below about 31° C. or about 87.8° F.), vapor of the coolant fluid could exist at that location if the static pressure of the coolant fluid at the main pump inlet 205 is not maintained above the corresponding saturation pressure of the coolant fluid associated with the main pump inlet ambient temperature. This an undesirable mode of operation of the system 201 because if the coolant fluid is a vapor as it enters the pump 203 it will require substantially more energy to compress the vaporous coolant fluid than if it were in a liquid state. This condition may be avoided through the use of a system wide mass accumulator, as generally indicated at 207, in which a low pressure accumulator tank 209 is maintained at a pressure below the pressure at the suction or inlet 205 of main pump 203, and a high pressure accumulator tank 211 that is maintained at a pressure above the pressure at the suction or inlet 205 of the main pump 203. An accumulator pump 213 has an inlet 215 in communication with high pressure tank 211 and with the return manifold 13 upstream of inlet 205 of main pump 203. The accumulator pump 213 further has an outlet 217 in communication with low pressure tank 209. A valve V1 is provided between return manifold 13 and the high pressure tank 211 for the flow of the working fluid from manifold 13 to the inlet of the accumulator pump 213. The low pressure tank 209 is in communication with supply manifold 7 upstream of the heat sources 3 to be cooled. A valve V2 is provided between the supply manifold 7 and the inlet to tank 209 for allowing communication of the pressure in manifold 7 to the low pressure accumulator tank 209. A process controller 219, such as a suitable programmable logic controller (PLC) or a digital signal controller (DSC) controls operation of (e.g., turns on/off) accumulator pump 213 and operates valves V1 and/or V2 so as to maintain the suction pressure at inlet 205 of main pump 203 above the saturation pressure of the $CO_2$ coolant fluid at the ambient temperature at the suction or inlet 205 side of the main pump thus ensuring that the coolant fluid is in a liquid state at the main pump inlet. Valves V1 and V2 may be controlled by process controller 219 so to as properly control operation of mass accumulator 207. It will be understood that the controller 219 may include temperature and pressure sensors (not shown in FIG. 4) at various locations around the system including at a location immediately upstream of the inlet to main pump 203. As the ambient temperature changes, the mass accumulator system 207, as controlled by controller 219, elevates the static pressure of the coolant fluid at the inlet 205 to pump 203 by allowing mass (e.g., $CO_2$ coolant fluid from high pressure accumulator tank 211) to enter the process loop 201 upstream of main pump 203 or to reduce the system pressure by extracting mass (coolant fluid) from the process loop through the use of valve V2.

For ambient temperatures below approximately 55° F., the coolant fluid effluent discharged from main pump 203, having been pressurized to a level above the supercritical pressure for the coolant fluid working medium (e.g., $CO_2$), is still in its liquid state because the coolant fluid or working medium is not above the associated working medium supercritical temperature. As previously mentioned, the supercritical point for $CO_2$ is about 31.01° C. and about 72.9 bar. As the working medium flows through heat sources 3, it absorbs heat from the heat sources such that the working medium (preferably $CO_2$) changes from its liquid state to its supercritical state. Accordingly, the state of the $CO_2$ working medium at the outlet of the heat source 3 (or at the inlet 9 and in the chamber 17 of its control valve 1) is supercritical. Thus, the state of the working medium or coolant fluid entering a respective control valve 1 is supercritical. Because little or no heat transfer occurs in the control valve 1, the $CO_2$ effluent or cooling fluid in the control valve would also be supercritical.

On warm/hot ambient conditions when the ambient temperature is warm enough that the $CO_2$ coolant fluid temperature at the inlet 205 of main pump 203 is above the supercritical temperature of the $CO_2$ coolant fluid (i.e., above 31.01° C. or 87.8° F.), a vapor could exist if the static pressure of the coolant fluid at the inlet 205 of main pump 203 is not maintained about the fluid associated supercritical pressure. The mass accumulator 207 in such case functions to maintain the static pressure at the inlet 205 of main pump 203 above the supercritical pressure (72.9 bar) of $CO_2$ with an absolute value being defined via a cycle optimization determination, which would be based upon achieving the maximum net power production of the expander or turbine 106, as shown in FIG. 4.

It will be appreciated that in the foregoing description and in the claims that follow, the terms "up", "down", "upwardly", "downwardly", "above", "below", "distal" "proximal", and similar terms merely indicate the directional and spatial relationships between various components of the control valve 1 when the control valve is oriented as shown in FIG. 1. However, those of ordinary skill in the art will recognize that the control valve and the other components of system S need not be oriented as they are illustrated in the drawings, but can be used in other orientations.

While the control valve, systems and methods described herein have been described in the context of specific preferred embodiments, those skilled in the art will understand that modifications and variations may be constructed and used without departing from the scope of the claims below.

The invention claimed is:

1. A control valve for computer processors for varying the supply of an operating fluid to a computer processor heat source in order to heat or cool the source, said control valve being operable in response to a change in temperature of the computer processor source so as to maintain the temperature of the computer processor source within a predetermined temperature range, said control valve comprising a valve body having a chamber therewithin, said chamber having an inlet in communication with the flow of the operating fluid from the source such that the temperature of the operating fluid from the source and within the chamber can reflect the temperature of the source, said chamber further having an outlet, a valve member disposed within said chamber responsive to changes in the temperature of the operating fluid within the chamber for effecting movement of said valve member between a closed position in which said valve member can substantially block the flow of said fluid from said chamber to said outlet and an open position in which the operating fluid within said chamber can flow from the chamber via said outlet, said valve member being of a material that can change shape in response to changes of temperature of the operating fluid within said chamber to effect movement of said valve member between its closed and open positions; wherein said valve member end is of a plurality of layers of dissimilar metal with each layer having a different coefficient of thermal expansion, and wherein said valve member is supported with respect to said housing and extends within said chamber so that upon the operating fluid within said chamber varying from a first predetermined temperature said valve member can flex within said housing relative to said outlet so as to effect the opening or closing of said outlet; wherein said housing has an outlet orifice between said inlet and outlet, said orifice when it is at least partially open can permit the flow of fluid from within the chamber to said outlet; and wherein said valve member is constructed of said dissimilar metal such that said valve member upon being heated above a first temperature can flex toward its fully open position in such fashion that the flow of operating fluid to the orifice can increase in a non-linear manner with respect to the increase in the temperature of the operating fluid within the chamber.

2. A computer processor control valve for varying the supply of an operating fluid to a computer processor heat source in order to heat or cool the computer processor source, said control valve being capable to be operable in response to a change in temperature of the computer processor source so as to maintain the temperature of the source within a predetermined temperature range, said control valve comprising a valve body having a chamber therewithin, said chamber having an inlet in communication with the flow of the operating fluid from the source such that the temperature of the operating fluid from the source and within the chamber can reflect the temperature of the source, said chamber further having an outlet; a valve member disposed within said chamber, said valve member being of a material that can change shape in response to changes of temperature of the operating fluid within said chamber to effect movement of said valve member between a closed position in which said valve member can substantially block the flow of said fluid from said chamber to said outlet and an open position in which the operating fluid within said chamber can flow from the chamber via said outlet; wherein said valve member is of a plurality of layers of dissimilar metal with each layer having a different coefficient of thermal expansion; said valve member being supported with respect to said housing and extending within said chamber so that upon the operating fluid within said chamber varying from a first predetermined temperature said valve member can flex within said housing relative to said outlet so as to effect the opening or closing of said outlet; wherein said valve member has a distal end and a proximal end, the said proximal end being fixedly cantilevered with respect to said housing, wherein said housing has an outlet orifice between said inlet and outlet, said orifice when it is at least partially open can permit the flow of fluid from within the chamber to said outlet, wherein with said valve member in its closed position, said valve member can substantially block the flow of fluid from within said chamber to said orifice; wherein said chamber has a distal end wall in sliding substantially sealing fit with the distal end of said valve member, and wherein said orifice is located in said distal end wall below the position of the distal end of the valve member when the valve member is in its closed position; and wherein said chamber has a pair of spaced side walls, and said valve member has a pair of side edges and a distal end edge, said edges being in sliding sealing relation to said chamber walls and configured for substantially sealing the sides of the valve member relative to the chamber when the valve member is in its closed position.

3. A computer processor control valve as set forth in claim 2 wherein said edges of said valve member are configured to permit the leakage of fluid from within said chamber to said outlet such that when the valve member is in its closed position, a minimum flow of operating fluid through said heat source and through said chamber is permitted such that the temperature of the operating fluid in said chamber reflects the temperature of the heat source.

4. A computer processor control valve as set forth in claim 2 wherein said valve member has one or more openings therein that permit a predetermined flow of operating fluid from said chamber to said outlet when said valve member is in its closed position so as to maintain a minimum flow of operating fluid through the heat source and through the chamber such that the temperature of the operating fluid in the chamber can reflect the temperature of the heat source.

5. A computer processor control valve as set forth in claim 2 wherein said distal end of said valve member is configured to be able to move in a curved path as it flexes, and wherein said distal end wall is curved to generally match the curved path of the distal end of the valve member so that the distal end of the valve member can maintain its sliding, sealing relation with respect to said distal end wall as it moves between its closed and open positions.

6. A computer processor control valve as set forth in claim 5 wherein said distal end wall above said orifice is curved to substantially match the curved path of said distal end of the valve member so that the valve member can flex upwardly beyond its closed position upon the temperature of the operating fluid in said chamber being below said first temperature so that its distal end can maintain its sliding sealing relations with said end wall as it flexes upwardly beyond its closed position.

7. A computer processor control valve as set forth in claim 6 wherein said side edges of said valve member remains in sliding sealing relation with the sides of said chamber as said valve member flexes upwardly beyond its said closed position.

8. A computer processor control valve as set forth in claim 2 wherein said orifice has a shape such that as said distal end of said valve member moves from its closed position toward its open position the flow of fluid through said open portion of said orifice increases in linear proportion to the movement of the distal end of the valve member from its closed position toward its open position.

9. A computer processor control valve as set forth in claim 2 wherein said orifice is configured to have a shape such that as said distal end of said valve member moves from its closed position toward its open position the flow of fluid through said open portion of said orifice increases in non-linear proportion to the movement of the distal end of the valve member from its closed position toward its open position.

10. A computer processor control valve as set forth in claim 2 wherein said valve member is constructed of said dissimilar metal such that said valve member upon being heated above a first temperature can flex toward its fully open position in such fashion that the flow of operating fluid to the orifice can increase in a linear manner with respect to the increase in the temperature of the operating fluid within the chamber.

11. A computer processor control valve as set forth in claim 2 wherein said valve member is constructed of said dissimilar metal such that said valve member being heated above a first temperature can flex toward its fully in open position in such fashion that the flow of operating fluid to the orifice can increase in a non-linear manner with respect to the increase in the temperature of the operating fluid within the chamber.

12. A system wherein there are a plurality of computer processor heat sources of the type of computer processor heat source of claim 2, for controlling the temperature of said plurality of said computer processor heat sources, the said system comprising a control valve as set forth in claim 2 associated with each of said computer processor heat sources to control the flow of operating fluid through each said heat source so as to maintain each of said computer processor heat sources within a desired range of operating temperatures.

* * * * *